United States Patent
Arakawa

[11] Patent Number: 5,800,205
[45] Date of Patent: Sep. 1, 1998

[54] CONTACT MECHANISM FOR IC TESTING

[75] Inventor: Osamu Arakawa, Tokyo, Japan

[73] Assignee: Ando Electrical Co., Ltd., Tokyo, Japan

[21] Appl. No.: 598,841

[22] Filed: Feb. 9, 1996

[30] Foreign Application Priority Data

Feb. 28, 1995 [JP] Japan ................................. 7-065018

[51] Int. Cl.⁶ ....................................................... H05K 1/00
[52] U.S. Cl. ............................................................ 439/526
[58] Field of Search ........................... 439/526, 70, 71, 439/264, 266

[56] References Cited

U.S. PATENT DOCUMENTS

| | | | |
|---|---|---|---|
| 4,750,890 | 6/1988 | Dube et al. | 439/70 X |
| 5,161,678 | 11/1992 | Garvey . | |
| 5,208,529 | 5/1993 | Tsurishima et al. | 439/70 X |
| 5,269,401 | 12/1993 | Ito et al. . | |
| 5,574,383 | 11/1996 | Saito et al. | 439/71 X |

FOREIGN PATENT DOCUMENTS

| | | |
|---|---|---|
| 61-169415 | 7/1986 | Japan . |
| 62-136409 | 6/1987 | Japan . |
| 5-97238 | 4/1993 | Japan . |
| 6-82583 | 11/1994 | Japan . |

Primary Examiner—Neil Abrams
Assistant Examiner—Daniel Wittels
Attorney, Agent, or Firm—Flynn, Thiel, Boutell & Tanis, P.C.

[57] ABSTRACT

A contact mechanism for connecting the leads of an IC package to an IC tester comprises a carrier block provided with an opening to receive therein an IC package provided with leads on its side surfaces, an IC connector connected to the IC tester, and a shifting mechanism for shifting the IC package received in the opening of the carrier block toward the IC connector after the carrier block has been joined to the IC connector, to bring the leads of the IC package into contact with the corresponding electrodes of the IC connector. The opening of the carrier block is tapered downward so that the leads of the IC package is guided by the inclined side surfaces of the opening as the IC package is pushed down toward the IC connector to position the leads of the IC package correctly relative to the corresponding electrodes of the IC connector.

8 Claims, 8 Drawing Sheets

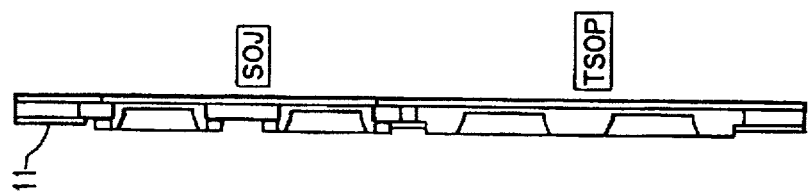
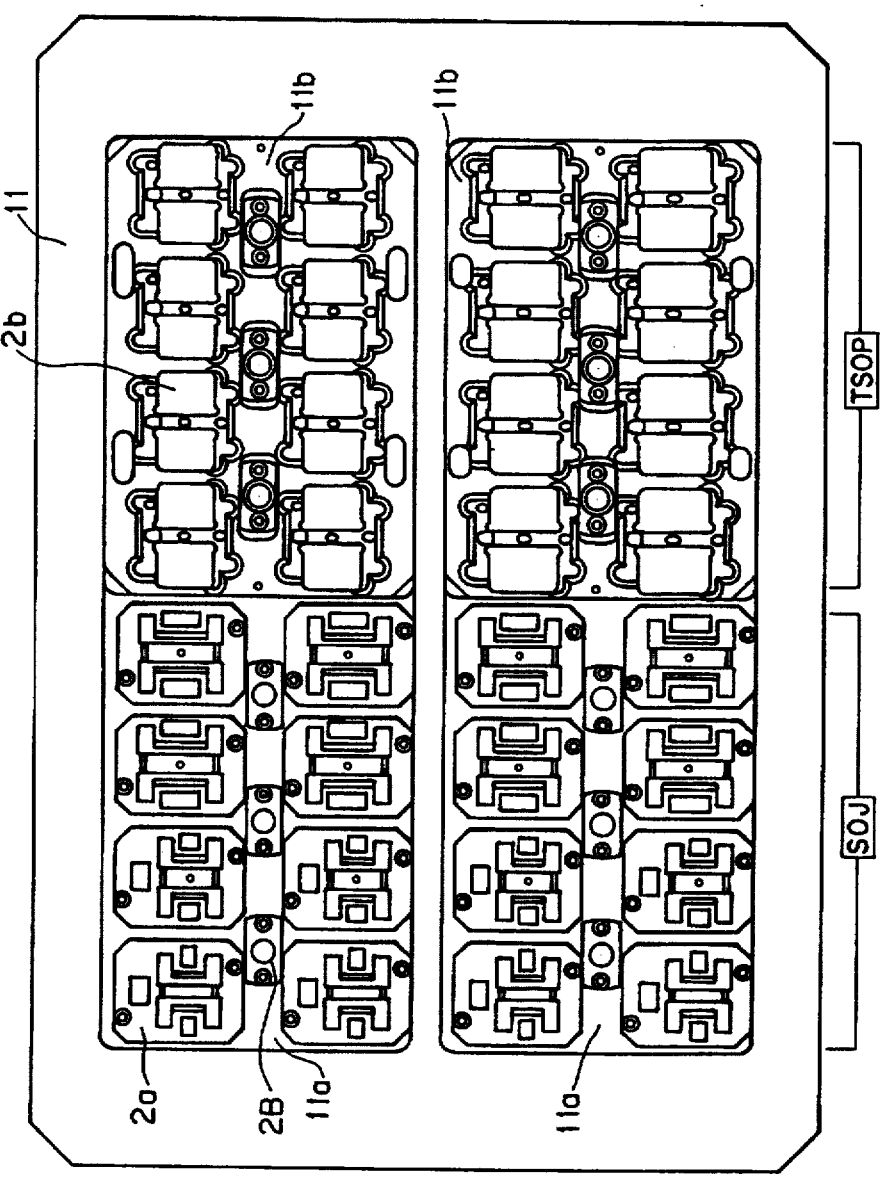
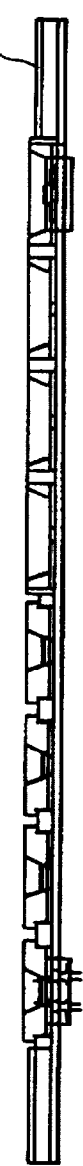

CONTACT MECHANISM FOR IC TESTING

BACKGROUND OF THE INVENTION

The present invention relates to a contact mechanism for IC testing and, more specifically, to a contact mechanism for bringing the leads of an IC package contained in a carrier into contact with the electrodes of an IC connector attached to a contact board.

DESCRIPTION OF THE RELATED ART

There have been proposed contact mechanisms for bringing the leads of an IC package contained in a carrier into contact with the corresponding electrodes of an IC connector to transfer electric signals provided by the IC package to an IC tester.

FIGS. 10 to 12 show a conventional contact mechanisms of this kind for connecting an SOJ package (small outline J-leaded package) to an IC tester, wherein (a) is a plan view and (b) is a side view. When connecting an IC package 20 to an IC connector 23 by the conventional contact mechanism, the IC package 20 is fed to the contact mechanism by the force of gravity, the IC package 20 is stopped by a stopper 21, and then a contact rail 22 is pressed against the IC package 20 by a pushing mechanism, not shown, to push the IC package 20 into the IC connector 23 so that the leads of the IC package 20 are brought into contact with corresponding electrodes 25, respectively. When the IC package 20 is pushed into the IC connector 23, guide rails 24 guide the IC package 20. After the leads of the IC package 20 have been connected to the electrodes 25, the pushing mechanism retracts the contact rail 22 to a position behind a feed line and the stopper 21 is retracted to allow the IC package 20 to fall into a classifying unit, not shown. A plurality of such contact mechanisms are installed to test a plurality of IC packages simultaneously.

Since this conventional contact mechanism presses the side surfaces of the leads of an IC package against the electrodes of the IC connector, the carrier capable of stably guiding the side surfaces of the leads could not have been used. Therefore, it has been practically difficult to bring the leads of a plurality of IC packages contained in a carrier into contact with the electrodes of IC connectors by a method used for bringing the leads of TSOPs (thin small outline packages) into contact with the electrodes of IC connectors.

SUMMARY OF THE INVENTION

Accordingly, it is an object of the present invention to provide a contact mechanism capable of bringing the leads of an IC packages contained in a carrier into contact with the corresponding electrodes of an IC connector.

With the foregoing object in view, the present invention provides a contact mechanism for connecting the leads of an IC package to an IC tester, comprising a carrier block provided with a downward tapered opening to receive therein an IC package provided with leads on its side surfaces, an IC connector connected to the IC tester, and a shifting mechanism for shifting the IC package received in the opening of the carrier block toward the IC connector after the carrier block has been joined to the IC connector, to bring the leads of the IC package into contact with the corresponding electrodes of the IC connector. The inclined side surfaces of the opening of the carrier block guide the leads of the IC package at the side surfaces of the leads when the IC package is shifted toward the IC connector.

Preferably, a stopper for stopping the IC package is disposed near the lower end of the opening so that a space to expose the leads of the IC package to the IC connector therethrough is formed between the carrier block and the stopper.

The carrier block is set on the IC connector, the shifting mechanism shifts the IC package received in the opening toward the IC connector to press the lower surfaces of the leads of the IC package against the corresponding electrodes of the IC connector. When the IC package is shifted toward the IC connector, the inclined side surfaces of the opening guide the IC package so that the lower surfaces of the leads of the IC package are brought into correct contact with the corresponding electrodes of the IC connector. Since the contact mechanism brings the IC package contained in the carrier block into contact with the corresponding electrodes of the IC connector, the frequency of jamming in the associated test system can be reduced.

BRIEF DESCRIPTION OF THE DRAWINGS

The above and other objects, features and advantages of the present invention will become more apparent from the following description taken in connection with the accompanying drawings, in which:

FIGS. 9(a), 9(b) and 9(c) are explanatory views showing a carrier plate included in a contact mechanism in a third embodiment according to the present invention;

DETAILED DESCRIPTION OF THE PREFERRED EMBODIMENTS

Figure 1A:
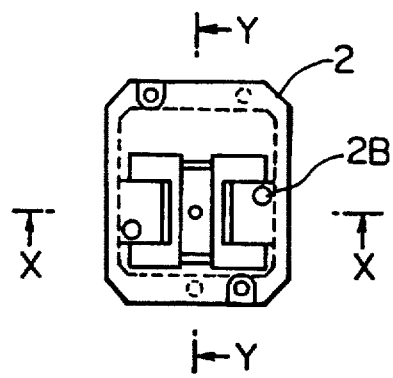
FIGS. 1(a), 1(b) and 1(c) are explanatory views of a carrier block included in a contact mechanism in a first embodiment according to the present invention.
Figure 1C:
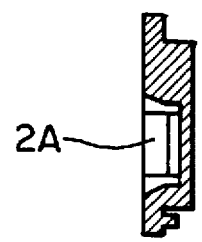
Figure 1B:
Figure 2A:
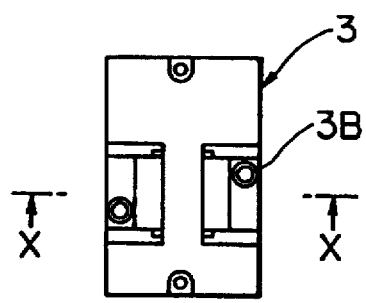
FIGS. 2(a), 2(b) and 2(c) are explanatory views of an IC connector included in the contact mechanism in the first embodiment.
Figure 2C:
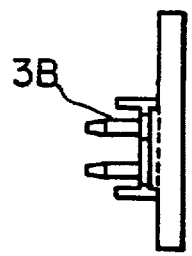
Figure 2B:
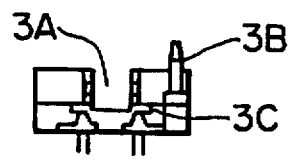

A contact mechanism in a first embodiment according to the present invention will be described with reference to FIGS. 1 to 6. FIG. 1(a) is a plan view of a carrier block 2 included in the contact mechanism, FIG. 1(b) is a sectional view taken on line X—X in FIG. 1(a), and FIG. 1(c) is a sectional view taken on line Y—Y in FIG. 1(a) and FIG. 2(a) is a plan view of an IC connector included in the contact mechanism and used in combination with the carrier block, FIG. 2(b) is a side view of the IC connector in FIG. 2(a), and FIG. 2(c) is a side view of the IC connector in FIG. 2(a).

Referring to FIG. 1, a carrier block 2 is provided with a downwardly tapered opening or channel 2A defined by inclined side surfaces along which the side surfaces of an IC package 20 or the side surfaces of the leads 20a of the IC package 20 are guided. A stopper 2C for stopping the IC package 20 is disposed near the lower end of the tapered opening 2A so that a space through which the lower portions of the leads 20a of the IC package 20 are exposed to an IC connector 3 as shown in FIGS. 3 to 6. The carrier block 2 is provided with positioning holes 2B for positioning the carrier block 2 relative to the IC connector 3.

Referring to FIG. 2, the IC connector 3 is provided with a downwardly tapered positioning hole 3A, positioning pins 3B to be fitted in the respective positioning hole 2B of the carrier block 2 when the carrier block 2 is joined to the IC connector 3, and electrodes 3C. The leads 20a of the IC package 20 received in the opening 2A of the carrier block 2 come into contact with the electrodes 3C, respectively, when the carrier block 2 and the IC connector 3 are joined together.

Figure 3:
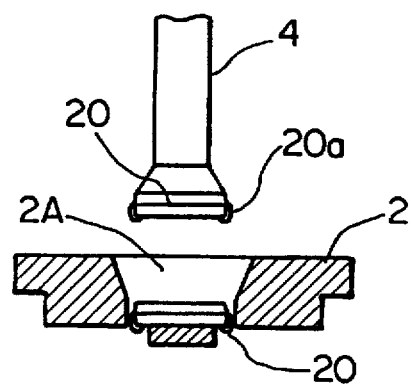
FIG. 3 is a sectional view of assistance in explaining a process of placing an IC package in the recess of the carrier block of FIGS. 1(a), 1(b) and 1(c)
Figure 4:
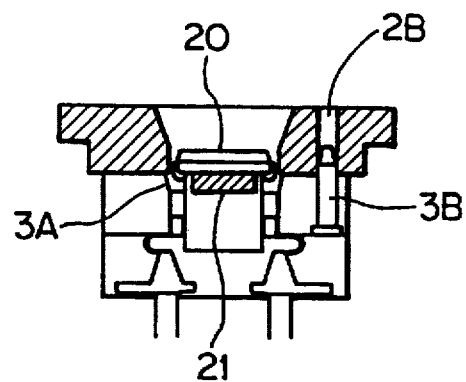
FIG. 4 is an explanatory view showing the carrier block as positioned relative to the IC connector of FIGS. 2(a), 2(b) and 2(c)
Figure 5:
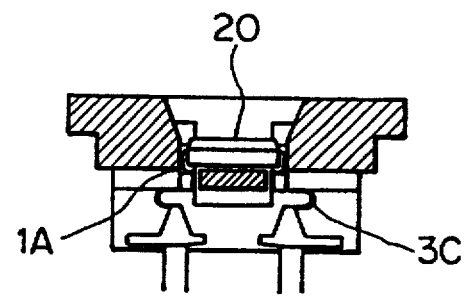
FIG. 5 is an explanatory view showing the IC package as positioned on the carrier block.

The operation of the contact mechanism for bringing the leads 20a of an SOJ IC package 20 into contact with the electrodes 3C of the IC connector 3 will be described with reference to FIGS. 3 to 6. Referring to FIG. 3, a suction carrier 4 picks up the IC package 20 taken out of a magazine and sets the IC package 20 in the opening 2A of the carrier block 2. Since the opening 2A of the carrier block 2 is downwardly tapered and the upper open end of the opening 2A is greater than the IC package 20, a dislocation in the range of about ±2 mm of the IC package 20 relative to the opening 2A is permitted. Then, as shown in FIG. 4, the carrier block carrying the IC package 20 is disposed directly above the IC connector 3 and lowered toward the IC connector 3 so that the positioning pins 3B of the IC connector 3 are received in the positioning holes 2B of the carrier block 2, respectively. In this state, the dislocation of the IC package 20 on the carrier block 2 relative to the IC connector 3 is in the range of about ±0.4 mm, which corresponds to the sum of the clearance between the positioning hole 2B and the positioning pins 3B, and the dislocation of the IC package 20 from a correct position on the carrier block 2. Then, the carrier block 2 is further lowered toward the IC connector 3. Consequently, the leads 20a of the IC package 20 are fitted in the downwardly tapered positioning hole 3A of the IC connector 3, so that the dislocation of the IC package 20 in the range of ±0.4 mm from the correct position on the carrier block 2 is corrected and the IC package 20 is positioned correctly relative to the IC connector 3 as shown in FIG. 5.

Figure 6:
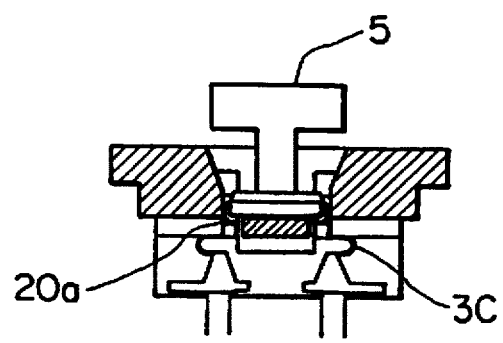
FIG. 6 is an explanatory view showing the IC package positioned with its leads in contact with the electrodes of the IC connector.

Then, a pusher 5 is lowered to apply a fixed pressure to the IC package 20. Consequently, the leads 20a of the IC package 20 are pressed against the corresponding electrodes 3C of the IC connector 3 connected to a tester, not shown, as shown in FIG. 6. Thus, the IC package 20 is connected through the leads 20a and the electrodes 3C to the tester. Signals provided by the IC package 20 are transferred through the leads 20a and the electrodes 3C to the tester for testing.

Figure 7:
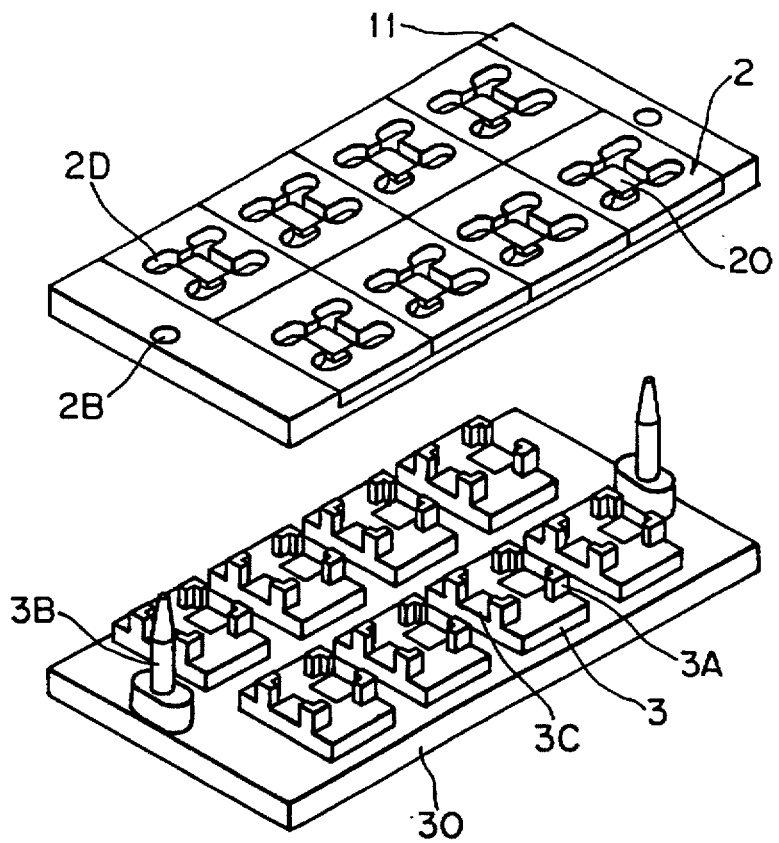
FIG. 7 is a perspective view of a contact mechanism in a second embodiment according to the present invention.
Figure 8:
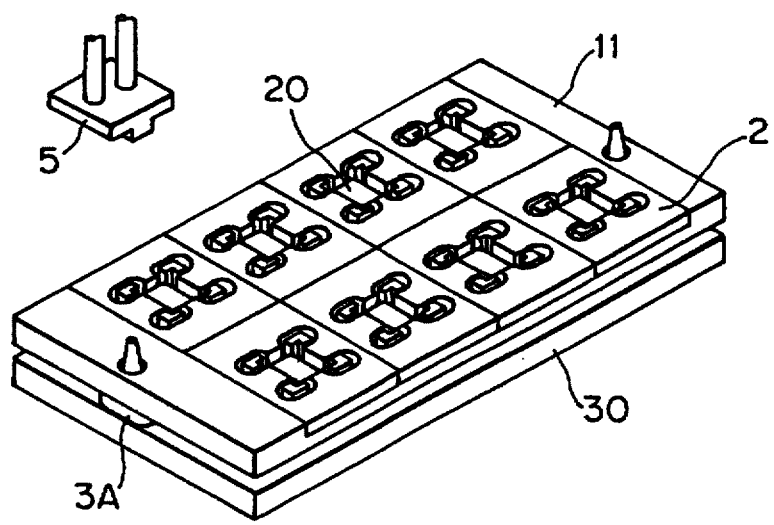
FIG. 8 is an explanatory perspective view showing a state where a carrier plate and a contact board included in the contact mechanism in the second embodiment are joined together.
Figure 10A:
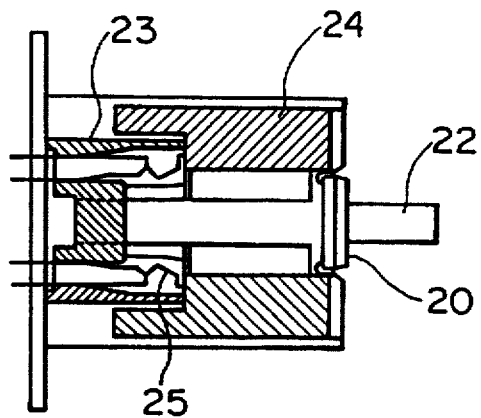
FIGS. 10(a) and 10(b) are explanatory views of assistance in explaining the functions and operations of a conventional contact mechanism.
Figure 10B:
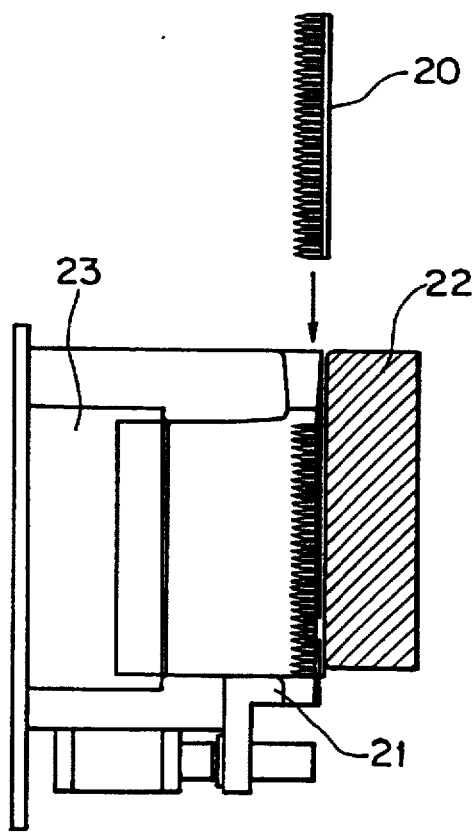
Figure 11A:
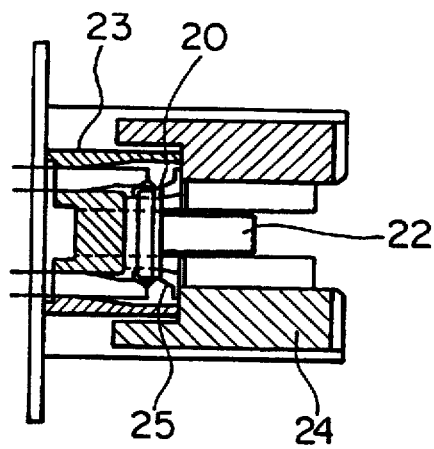
FIGS. 11(a) and 11(b) are explanatory views of assistance in explaining the functions and operations of the conventional contact mechanism.
Figure 11B:
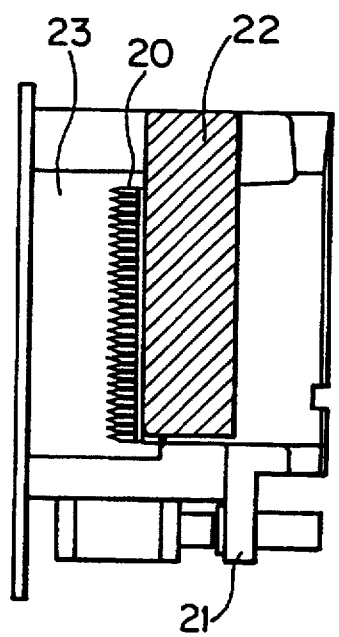
Figure 12A:
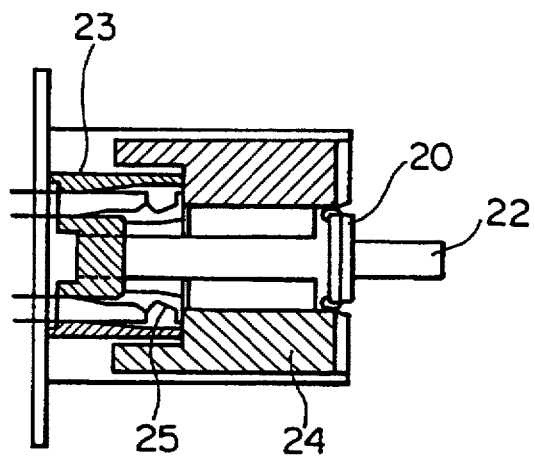
FIGS. 12(a) and 12(b) are explanatory views of assistance in explaining the functions and operations of the conventional contact mechanism.
Figure 12B:
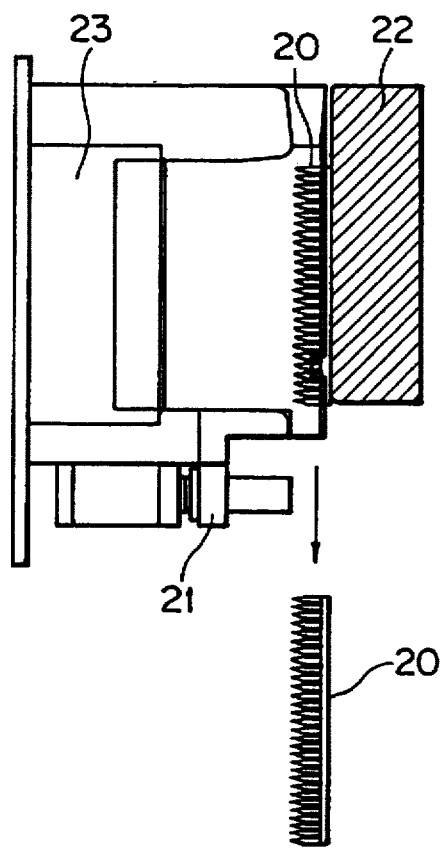

A contact mechanism in a second embodiment according to the present invention for bringing the leads of an SOJ IC package to an IC connector will be described with reference to FIGS. 7 and 8. Referring to FIG. 7, eight carrier blocks 2 are fixedly supported on a carrier plate 11, and eight IC connectors 3 are attached to a connector board 30. Each carrier block 2 and each IC connector 3 are substantially the same in construction and function as the carrier block 2 and the IC connector 3, respectively, of the first embodiment except that the carrier blocks 2 are not provided with any positioning holes and the IC connectors 3 are not provided with any positioning pins, and hence the description thereof will be omitted. The carrier blocks 2 are formed of a synthetic resin or the like since they guide the leads of IC packages.

The carrier plate 11 is provided with two positioning holes or apertures 2B and the connector board 30 is provided with two positioning pins 3B corresponding to the positioning holes 2B, respectively. The carrier plate 11 is provided with holes 2D to provide clearances for the guide projections 3A of the IC connectors 3. Guide projections 3A of the IC connectors 3 are fitted in the holes 2D when the carrier plate 11 and the connector board 30 are joined together as shown in FIG. 8. When the carrier plate 11 is joined to the connector board 30, the IC packages 20 carried on the carrier blocks 2 are positioned relative to the IC connectors 3, respectively, as shown in FIG. 5. The IC packages 20 are pushed toward the IC connectors 3 by a pusher 5 to press the leads 20a of the IC packages 20 against the electrodes 3C of the corresponding IC connectors 3, respectively.

FIGS. 9(a), (b) and (c) show shows a carrier plate 11 included in a contact mechanism in a third embodiment according to the present invention. Two carrier plates 11a for carrying SOJ IC packages and two carrier plates 11b for carrying TSOPs are attached to the carrier plate 11. Each carrier plate 11a is provided with eight carrier blocks 2a for holding SOJ IC packages, and each carrier plate 11b is provided with eight carrier blocks 2b for holding TSOPs. This carrier plate 11 is intended for use in a practical test process and hence each carrier plate 11a is provided with eight carrier blocks 2a and each carrier plate 11b is provided with eight carrier blocks 2b to avoid the undesirable influence of the thermal expansion and thermal contraction of the carrier plates 11a and 11b on test results, because the ambient temperature is varied in a wide range during tests.

All the carrier plates 11a and 11b are formed in the same external shape as that of a carrier plate for carrying TSOPs, and all the carrier blocks 2a and 2b are formed in the same external shape as that of a carrier block for carrying a TSOP to use the carrier plate 11 for both carrying carrier blocks for carrying TSOPs and carrying carrier blocks for carrying SOJ packages to enable one tester to tests both SOJ packages and TSOPs.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A contact mechanism for connecting leads of an IC package to an IC tester, the IC package having leads on side surfaces thereof, said contact mechanism comprising:

a carrier block having a vertically extending opening for receiving an IC package therein and a stopper disposed near a lower end of the opening for supporting and positioning said IC package in said opening, said opening being defined between opposed side surfaces which are downwardly tapered so that greater clearance is provided at an upper end of the opening than at the lower end of the opening, said side surfaces and said stopper being spaced from each other to form gaps therebetween through which the leads of the IC package project when the IC package is positioned in said opening and is engaged with the stopper;

an IC connector connected to the IC tester, the IC connector being adapted to receive the carrier block having the IC package therein, the IC connector having electrodes for connecting the leads of the IC package extending through the gaps to the IC tester; and a shifting mechanism for shifting the IC package positioned in the opening of the carrier block toward the IC connector after the carrier block has been joined to the IC connector so as to bring the leads of the IC package into contact with the corresponding electrodes of the IC connector;

the opening of said carrier block being tapered downwardly so that the leads of the IC package are guided by the tapered side surfaces of the opening as the IC package is pushed down toward the IC connector to contact the leads of the IC package to the electrodes of the IC connector.

2. The contact mechanism according to claim 1, wherein said stopper is stationary with respect to the carrier block.

3. A contact mechanism for connecting leads of IC packages to IC testers, said contact mechanism comprising:

a carrier block having a plurality of openings respectively receiving a plurality of the IC packages therein and a stopper disposed near a lower end of each said opening for supporting the IC package in said opening and positioning the IC package, each said opening being defined by downwardly tapered side surfaces so that greater clearance is provided at an upper end of the opening than at the lower end of the opening, said side surfaces of said opening and said stopper being offset from each other to form gaps therebetween, said gaps receiving the leads of the IC package when an IC package is positioned in said opening;

an IC connector connected to the IC tester, the IC connector being adapted to receive the carrier block having the IC packages therein, the IC connector having a plurality of electrodes for connecting the leads of the IC packages to the IC tester; and a shifting mechanism for shifting the IC packages received in the openings of the carrier block toward the IC connector after the carrier block has been joined to the IC connector so as to bring the leads of each IC package into contact with the corresponding electrodes of the IC connector;

each opening of said carrier block being tapered downwardly so that the leads of each IC package are guided by the tapered side surfaces of the opening as the IC package is pushed down toward the IC connector so that the leads of the IC package project through the gaps for contact with the electrodes of the IC connector.

4. The contact mechanism according to claim 3, wherein said stopper is stationary with respect to the carrier block.

5. The contact mechanism according to claim 4, wherein said IC packages are both small outline J-lead IC packages and thin small outlined IC packages.

6. A contact mechanism for connecting packaged ICs to an IC tester, each IC having a generally flat package and a plurality of leads that project downwardly from a bottom surface of the package adjacent opposite sides thereof, comprising:

a plate for carrying a plurality of packaged ICs, said plate having an aperture therein and having upper and lower surfaces, said plate also including a plurality of carrier blocks each adapted to receive one of the plurality of packaged ICs therein;

each said carrier block having a channel extending from the upper surface to the lower surface for receiving a horizontally-oriented packaged IC, said channel having an upper opening at said upper surface and a lower opening at said lower surface, two opposing side surfaces of said channel being inclined relative to vertical from the upper surface toward the lower surface so that said upper opening is larger than said lower opening to provide greater clearance for receiving one packaged IC at said upper opening, a stop being fixedly positioned in said lower opening adjacent the lower surface of the plate, a gap being defined between the stop and each of the opposing side surfaces of said channel, the leads of the packaged IC extending downwardly through said gaps when said bottom surface of said package is supported by said stop; and a connector board for receiving said plate for connecting the leads of the packaged ICs positioned in said carrier blocks to the IC tester, said connector board having (1) a pin extending therefrom receivable in said aperture when said plate is joined to said connector board and (2) a plurality of connectors that respectively correspond to said plurality of carrier blocks, said pin when engaged with said aperture correctly positioning said plate on said connector board, and each said connector having a plurality of electrodes that are respectively contacted by said leads of said packaged ICs extending into said gaps when said plate is joined to said connector board.

7. The contact mechanism according to claim 6, wherein holes are provided in said carrier block, and guide projections extend upwardly from said connectors and are received in said holes to position said carrier blocks relative to said connectors when said carrier plate is joined onto said connector board.

8. The contact mechanism according to claim 6, wherein said plate has first and second parts, said first part being adapted to hold small outline J-lead packaged ICs, and said second part being adapted to hold thin small outline packaged ICs.

* * * * *